United States Patent [19]

McGinn et al.

[11] Patent Number: 4,482,422

[45] Date of Patent: Nov. 13, 1984

[54] METHOD FOR GROWING A LOW DEFECT MONOCRYSTALLINE LAYER ON A MASK

[75] Inventors: Joseph T. McGinn, Flemington; Lubomir L. Jastrzebski, Plainsboro; John F. Corboy, Jr., Ringoes, all of N.J.

[73] Assignee: RCA Corporation, New York, N.Y.

[21] Appl. No.: 352,883

[22] Filed: Feb. 26, 1982

[51] Int. Cl.³ .............................................. C30B 25/04
[52] U.S. Cl. .................................................... 156/612
[58] Field of Search ............................. 156/610-614, 156/DIG. 64, DIG. 68, DIG. 111, 649, 657, 662; 148/175, 187; 357/20, 50; 29/578

[56] References Cited

U.S. PATENT DOCUMENTS

| | | | |
|---|---|---|---|
| 3,239,372 | 3/1966 | Sirtl | 117/201 |
| 3,377,182 | 4/1968 | Von Bernuth | 117/4 |
| 3,425,879 | 2/1969 | Shaw et al. | 156/612 |
| 3,746,908 | 7/1973 | Engeler | 315/10 |
| 3,945,864 | 3/1976 | Goldsmith | 148/175 |
| 3,985,590 | 10/1976 | Mason | 156/612 |

FOREIGN PATENT DOCUMENTS

WO81/02948 10/1981 PCT Int'l Appl. ................. 156/612
963799 7/1964 United Kingdom .
1358438 7/1974 United Kingdom .

OTHER PUBLICATIONS

The "Epicon" Array: A New Semiconductor Array-Type Camera Tube Structure, W. E. Engeler et al., Applied Physics Letters, vol. 16, No. 5, Mar. 1, 1970, pp. 202-205.
The Epicon Camera Tube: An Epitaxial Diode Array Vidicon, S. M. Blumenfeld et al., IEEE Trans., vol. ED18, No. 11, Nov. 1971, pp. 1036-1042.
Advances in Dichlorosilane Epitaxial Technology, D. J. DeLong, Solid State Technology, Oct. 1972, pp. 29-34, 41.
The Status of Silicon Epitaxy, W. R. Runyan, Semiconductor Silicon, R. R. Haberrecht & E. L. Klein, Eds., New York: Electrochemical Society, May 1969, pp. 169-188.
Selective Epitaxial Deposition of Silicon, B. D. Joyce et al., Nature, vol. 195, pp. 485, 6, Aug. 4, 1962.
"The Growth and Etching of Si Through Windows in $SiO_2$", W. G. Oldham and R. Holmstrom, Solid State Science, vol. 114, No. 4, Apr. 1967.
"Selective Epitaxy of Silicon Under Quasi-Equilibrium Conditions", Erhard Sirtl and Hartmut Seiter, Electrochemical Society, May 1969, pp. 169-188.
"A Technique for Producing Epitaxial Films on Reusable Substrates", R. W. McClelland, C. O. Bozler, J. C. C. Fan, Appl. Phys. Lett., vol. 37, (6), p. 560, Sep. 15, 1980.

Primary Examiner—David L. Lacey
Attorney, Agent, or Firm—Birgit E. Morris; Donald S. Cohen; Kenneth R. Glick

[57] ABSTRACT

An apertured mask layer is disposed on a substrate having a monocrystalline portion at a surface thereof. Essentially all edges of the mask apertures are parallel to a predetermined crystallographic direction. A monocrystalline layer is then deposited such that it grows within the mask apertures and over the mask in a direction perpendicular to the aperture edges.

13 Claims, 4 Drawing Figures

METHOD FOR GROWING A LOW DEFECT MONOCRYSTALLINE LAYER ON A MASK

BACKGROUND OF THE INVENTION

The present invention relates to a method for epitaxially forming a monocrystalline layer of a material such as silicon or germanium. More particularly, it relates to a process for fabricating a monocrystalline layer through an aperture in a mask which is disposed on an appropriate crystalline substrate.

Structures incorporating a monocrystalline silicon layer overlying a mask layer can potentially have a significant impact in the semiconductor industry. For example, the ability to fabricate monocrystalline silicon over an insulating silicon dioxide mask layer makes possible the fabrication of a "three dimensional" integrated circuit wherein devices in a given monocrystalline layer might overlie, yet be isolated from, devices in an underlying monocrystalline silicon layer.

A method for fabricating a monocrystalline silicon layer over a non-crystalline layer such as silicon dioxide is disclosed in copending and commonly assigned U.S. patent application Ser. No. 338,958, Method for Growing Monocrystalline Silicon on a Mask Layer, J. F. Corboy, Jr. et al., filed Jan. 12, 1982. In the fabrication technique disclosed therein, a semiconductor substrate is provided, the substrate having a monocrystalline portion at a surface thereof. A mask layer of a material such as silicon dioxide is formed over the substrate surface, and an aperture corresponding to a monocrystalline portion of the substrate is generated in the mask layer. Silicon is then epitaxially deposited from a gas mixture which comprises a silicon-source gas, and a carrier gas. The substrate is next exposed to a gas mixture comprising an etching gas and a carrier gas such that a portion of the previously deposited silicon is etched. The deposition and etching cycle is then repeated an appropriate number of times so as to achieve a monocrystalline silicon layer of predetermined size on the mask layer.

As disclosed herein, we have now discovered that the quality of a deposited monocrystalline film is strongly dependent upon the configuration and orientation of the mask aperture.

SUMMARY OF THE INVENTION

A monocrystalline layer is formed over an apertured mask layer disposed on a substrate. The mask aperture is disposed over a monocrystalline portion of the substrate and the monocrystalline layer nucleates from a portion of the substrate within the aperture. The configuration and orientation of the mask aperture should be such that it provides an edge substantially parallel to a particular crystallographic direction in the monocrystalline layer.

DETAILED DESCRIPTION

In the semiconductor industry, monocrystalline material such as silicon is commonly grown in the form of a cylindrical boule. The boule is then sliced transverse to its cylindrical axis so as to yield a plurality of disc-shaped monocrystalline wafers. Depending upon the crystallographic orientation of the boule, the wafers which are cut therefrom will have planar major surfaces which correspond to a particular crystallographic plane.

Figure 1:
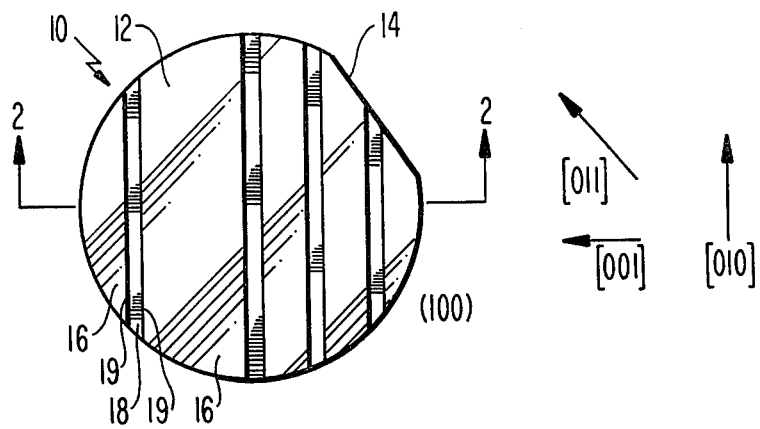
FIG. 1 represents a view of a major surface of a conventional circular semiconductor wafer having an apertured mask of the present invention disposed thereon.

Illustrated in FIG. 1 is a conventionally fabricated monocrystalline wafer 10 which in the preferred embodiment is silicon. The illustration is drawn such that the major surface 12 is coplanar with the sheet of paper and represents the {100} family of planes; the {100} family of planes incorporating the (100), (010), and (001) planes. Hereinafter the surface 12 of the wafer 10 will be referred to as the (100) plane, although it should be recognized that the surface 12 can equivalently represent any of the {100} family of planes.

Silicon, a very commonly used semiconductor wafer material, has a diamond cubic crystalline structure. For many applications in which single crystalline silicon is used as a substrate for further processing, the preferred orientation is to have the (100) plane at the major wafer surface 12, as illustrated in FIG. 1. It is desirable to have the (100) plane at the major surface 12 in applications where silicon dioxide is to be formed on the surface 12, as it is, for example, in metal-oxide-semiconductor-field-effect-transistors (MOSFETs) and in circuits incorporating MOSFETs. Apparently, the silicon/silicon dioxide interface produced along a (100) crystallographic plane produces a lower surface state density and traps fewer carriers than does the silicon/silicon dioxide interface produced at other silicon crystallographic planes.

As further illustrated in FIG. 1, a chamfered flat 14 is typically provided along a portion of the perimeter of the otherwise circular wafer 10. The flat 14, indicates crystallographic orientation, and when it is located on a (100) plane it might correspond, for example, to a [011] direction. Again, the [011] direction is referred to herein for convenience. Any of the <011> family of directions lying on the (100) plane, (i.e. the [011], [0;$\bar{1}$1], and [0$\bar{1}$1] would be equivalent. In the embodiment illustrated in FIG. 1, the flat 14 corresponds to the [011] direction. It should be noted that the [001] direction is oriented 45° from the [011] direction and 90° from the [010] direction, and that both the [001] and [010] directions lie on the (100) plane.

In accordance with the present invention, a mask layer 16 having a single aperture 18 or plurality of apertures 18 therein is disposed on the wafer surface 12. In the preferred embodiment the mask layer 16 is silicon dioxide, however, a variety of other materials, such as silicon nitride, sapphire, spinels or garnets might be used as well. The apertures 18 must each include a substantially straight edge 19 which is parallel to one of the <010> directions in the plane of the substrate surface. Hereinafter, this will be referred to as the [010] direction. In the preferred embodiment, a pair of straight, parallel edges 19 is the dominant feature of each aperture, yielding a stripe-shaped feature which terminates at the wafer edges.

In practicing the present invention it is not essential that each aperture be stripe-shaped or that each aperture extend across the entire wafer surface. However, as will be elaborated upon herein, the overall crystalline quality of a subsequently epitaxially grown monocrystalline layer will be best when the apertures are stripe-shaped and terminate at the wafer edge. This is because we have found that crystalline defects in a subsequently epitaxially formed layer are typically generated at aperture corners, where the growth direction changes. When the apertures are to be contained within the boundaries of the wafer, the optimum aperture shape is rectangular, with a length/width aspect ratio as high as other design and processing constraints permit.

In the illustrated embodiment four apertures 18 are shown, however, there may be as few as one aperture or greater than four apertures. Although there is no requirement as to the number of apertures or the spacing therebetween, it is important that the edges of the apertures be parallel to each other and to the [010] direction.

Figure 2:
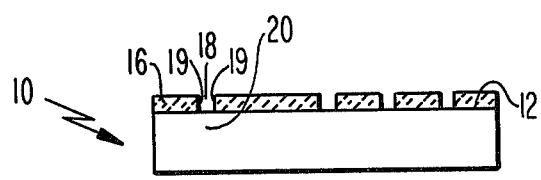
FIGS. 2-4 are sectional views of the wafer of FIG. 1 which further illustrate the process sequence of the present invention.

FIG. 2 illustrates a sectional view across a diameter of the wafer 10 which is transverse to the apertures 18. The mask layer 16 might have a thickness ranging from approximately 0.1 micron to several microns and the apertures 18 extend through the thickness of the mask layer 16 so as to expose nucleation sites 20 at the surface 12 of the wafer 10.

It should at this point be recognized that although the wafer 10 has heretofore been described in terms of being a uniform monocrystalline substrate, it is only necessary that the substrate be monocrystalline and be of the indicated orientation in the areas of the nucleation sites 20. For example, the wafer 10 might comprise an amorphous or polycrystalline material, so long as the nucleation sites 20 exposed by the apertures 18 are monocrystalline and (100) type in structure.

Figure 3:
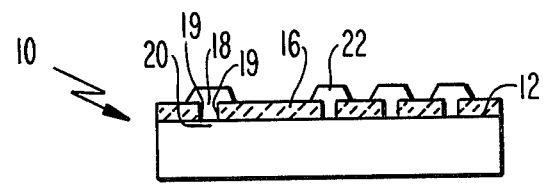

As illustrated in FIG. 3, silicon is next epitaxially deposited such that a monocrystalline island 22 grows from each nucleation site 20, through each aperture 18, and over the mask 16. So as to assure that each island 22 is a single crystal, a deposition/etching cycle, such as that disclosed in the previously cited copending patent application Ser. No. 338,958, can be used. When the aperture edges 19 are oriented in the [010] direction as disclosed herein, each island 22 will grow laterally, across the surface of the mask 16, in a [001] direction. Growth in this direction, perpendicular to the edges 19 of each aperture 18, produces a relatively high quality crystal structure when compared with growth in other crystallographic directions.

We theorize that the highest quality crystal structure occurs when growing in the [001] direction because the [001] direction is furthest from the [011] direction in the diamond cubic crystal structure. The [011] direction lies on the ($\bar{1}$11) plane, and the ($\bar{1}$11) plane is a member of the family of slip planes in a diamond cubic structure. If crystalline growth proceeded in the [011] direction, any defects generated could readily enter the ($\bar{1}$11) plane and then propagate easily throughout the crystal structure. Since the [001] direction is furthest from the [011] direction, growth in the [001] direction minimizes the mobility of defect propagation.

Figure 4:
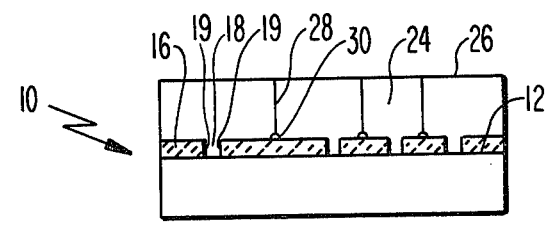

As illustrated in FIG. 4, if the epitaxial deposition process is continued, the islands 22 will eventually merge so as to form a substantially uniform monocrystalline silicon layer 24 overlying the mask 16. This monocrystalline silicon layer 24 can be used as a substrate for device processing in much the same manner as a bulk semiconductor wafer might be used. Additionally, a mask might be generated on the surface 26 of the layer 24 and the processing sequence described herein can be repeated. Alternatively, the monocrystalline layer 24 might be selectively etched so as to yield a shaped pattern or a plurality of silicon islands either isolated from the underlying substrate by the mask layer 16 or contacting the substrate through the apertures 18.

It should be noted that we have observed crystalline defects to occur along the interface where neighboring islands 22 eventually merge. These are indicated in FIG. 4 by line defects 28 and voids 30. However, the detrimental effect of these defects to the crystallinity of the layer 24 is minimized if the geometry of the apertures 18 is of the described stripe or high-aspect-ratio-rectangle configuration.

It should also be noted that although in the preferred embodiment of the present invention the major surfaces of the silicon, diamond cubic wafer are in the (100) plane, there are also preferred crystallographic growth directions when the major wafer surface 12 is instead coplanar with the {111} family of planes. We have found that when the major surface 12 is coplanar with the (111) plane for example, that the apertures 18 should be oriented such that their long edges 19 are oriented along the <211> family of directions.

Furthermore, it should be recognized that although the present invention has been described in terms of silicon crystalline growth from a silicon wafer, the invention is not limited to either silicon, homoepitaxial growth, or diamond cubic materials. The concept disclosed herein is applicable to other diamond cubic materials such as germanium, and to the heteroepitaxial growth of one diamond cubic crystalline material on a dissimilar diamond cubic crystalline material, such as germanium on silicon. The invention is also applicable to face centered cubic (FCC) materials since an FCC crystal has a similar preferred growth direction [001] or [010] on a (100) plane. The invention thus also permits the fabrication of a relatively high quality epitaxial FCC layer from a diamond cubic nucleation site, and vice versa.

Additionally, it is expected that the present invention can be used to epitaxially grow a relatively high crystalline quality FCC or diamond cubic layer on a substrate of hexagonal close pack (HCP) structure such as sapphire (single crystal Al$_2$O$_3$). However, this requires an initial determination of what crystallographic orientation of the nucleation site corresponds to the preferred <001> growth direction in the epitaxial layer.

What is claimed is:

1. A method for forming a low-defect monocrystalline layer on a mask, comprising the steps of:
   providing a substrate having a monocrystalline surface portion of predetermined crystallographic orientation;
   forming a mask on the substrate, the mask including an aperture which is disposed over the monocrystalline surface portion and which is shaped such that substantially all of its edges are parallel to a predetermined crystallographic direction on the monocrystalline surface portion; and
   epitaxially depositing a crystalline material having crystallographic slip planes therein, such that the material forms a monocrystalline layer on the substrate surface portion and grows in a predetermined crystallographic direction over the mask, said predetermined crystallographic direction being perpendicular to said aperture edges and being the direction which is furthest from the slip planes within said monocrystalline layer.

2. A method in accordance with claim 1 wherein the monocrystalline surface portion is a diamond cubic {100} plane and said mask aperture edges are parallel to a <001> direction.

3. A method in accordance with claim 2 wherein the substrate is silicon.

4. A method in accordance with claim 3 wherein the mask is silicon dioxide.

5. A method in accordance with claim 4 wherein the aperture is substantially stripe-shaped.

6. A method in accordance with claim 4 wherein the aperture is rectangularly shaped.

7. A method in accordance with claim 4 wherein said epitaxially deposited material comprises silicon.

8. A method in accordance with claim 1 wherein the monocrystalline surface portion is a face centered cubic {100} plane and said mask aperture edges are parallel to a <001> direction.

9. A method in accordance with claims 2 or 8 wherein said epitaxially deposited material comprises a diamond cubic material.

10. A method in accordance with claims 2 or 8 wherein said epitaxially deposited material comprises a face centered cubic material.

11. In a method for forming monocrystalline material over an apertured mask layer disposed on a substrate, wherein a mask aperture is disposed over a {100} surface portion of the substrate, the monocrystalline material has {111} slip planes and the monocrystalline material extends from the substrate and overlaps the mask, the improvement comprising:

forming the mask aperture such that substantially all of its edges are parallel to a predetermined <001> crystallographic direction in the formed monocrystalline material.

12. In a method for forming monocrystalline material over an apertured mask layer disposed on a substrate, wherein a mask aperture is disposed over a {111} surface portion of the substrate, the monocrystalline material has {111} slip planes and the monocrystalline material extends from the substrate and overlaps the mask, the improvement comprising:

forming the mask aperture such that substantially all of its edges are parallel to a predetermined <211> crystallographic direction in the formed monocrystalline material.

13. A method in accordance with claims 11 or 12 wherein the mask aperture is stripe-shaped.

* * * * *

UNITED STATES PATENT AND TRADEMARK OFFICE
CERTIFICATE OF CORRECTION

PATENT NO. : 4,482,422

DATED : November 13, 1984

INVENTOR(S) : Joseph T. McGinn et al.

It is certified that error appears in the above-identified patent and that said Letters Patent is hereby corrected as shown below:

Column 2, line 41, change "[0;$\bar{1}$1]" to --[0$\bar{1}$1]--.

Column 2, line 42, change "[011]" to --[01$\bar{1}$]--.

Signed and Sealed this

Twenty-sixth Day of March 1985

[SEAL]

Attest:

DONALD J. QUIGG

Attesting Officer     Acting Commissioner of Patents and Trademarks